United States Patent [19]
Takata

[11] Patent Number: 6,154,387
[45] Date of Patent: Nov. 28, 2000

[54] SEMICONDUCTOR MEMORY DEVICE UTILIZING A POLARIZATION STATE OF A FERROELECTRIC FILM

[75] Inventor: Hidekazu Takata, Nara, Japan

[73] Assignee: Sharp Kabushiki Kaisha, Japan

[21] Appl. No.: 09/249,477

[22] Filed: Feb. 12, 1999

[30] Foreign Application Priority Data

Feb. 19, 1998 [JP] Japan .................................. 10-037152

[51] Int. Cl.$^7$ .................................................. G11C 11/22
[52] U.S. Cl. ........................................... 365/145; 365/149
[58] Field of Search .................................... 365/145, 149, 365/230.06

[56] References Cited

U.S. PATENT DOCUMENTS

| | | | |
|---|---|---|---|
| 4,888,733 | 12/1989 | Mabley | 365/145 |
| 5,309,391 | 5/1994 | Papaliolios | 365/145 |
| 5,357,460 | 10/1994 | Yusuki et al. | 365/145 |
| 5,764,561 | 6/1998 | Nishimura | 365/145 |
| 5,917,746 | 6/1999 | Seyyedy | 365/145 |

FOREIGN PATENT DOCUMENTS 9-139091  5/1997  Japan .

OTHER PUBLICATIONS

Sumi et al. "FA 16.2: A 256kb Nonvolatile Ferroelectric Memory at 3V and 100ns" 1994 *IEEE International Solid–State Circuits Conference, Digest of Technical Papers* (1994) 268–269.

*Primary Examiner*—David Nelms
*Assistant Examiner*—David Lam
*Attorney, Agent, or Firm*—Morrison & Foerster LLP

[57] ABSTRACT

The semiconductor memory device of this invention includes a capacitor, a first transistor, and a second transistor, wherein the capacitor includes a first electrode, a second electrode opposing the first electrode, and a ferroelectric film sandwiched by the first and second electrodes, and stores and holds binary information utilizing a polarizing state of the ferroelectric film, the first transistor includes a first electrode, a second electrode, and a gate electrode, the second electrode being connected to the first electrode of the capacitor, and the second transistor includes a first electrode, a second electrode, and a gate electrode, the first electrode being connected to the second electrode of the capacitor.

5 Claims, 8 Drawing Sheets

PRIOR ART

*FIG. 6*

PRIOR ART

SEMICONDUCTOR MEMORY DEVICE UTILIZING A POLARIZATION STATE OF A FERROELECTRIC FILM

BACKGROUND OF THE INVENTION

1. Field of the Invention

The present invention relates to a nonvolatile semiconductor memory device for storing and holding information utilizing a polarization state of a ferroelectric film sandwiched between electrodes of a capacitor.

2. Description of the Related Art

Figure 6:
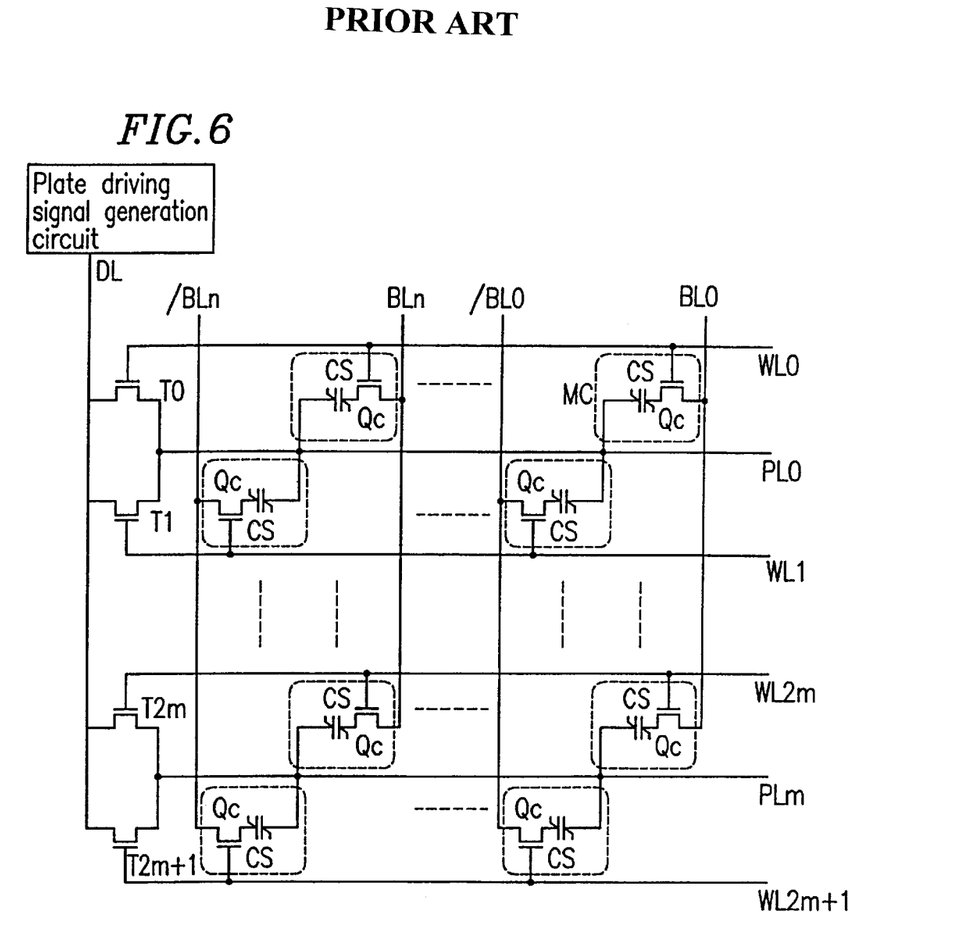
FIG. 6 is a conventional ferroelectric memory device.

A semiconductor memory device using a ferroelectric (hereinafter, referred to as a ferroelectric memory device) is a nonvolatile memory which stores data utilizing the polarization direction of the ferroelectric. FIG. 6 shows an exemplary conventional nonvolatile semiconductor memory device using this type of ferroelectric. See, for example, T. Sumi et al., 1994 IEEE International Solid-State Circuits Conference, Digest of Technical Papers, pp. 268–269.

The ferroelectric memory device shown in FIG. 6 includes a plurality of memory cells MC each including a capacitor Cs and a MOS transistor Qc. The capacitor Cs has two opposing electrodes and a ferroelectric film sandwiched by the electrodes. One of the electrodes of the capacitor Cs is connected to one of a source electrode and a drain electrode of the MOS transistor Qc. The plurality of memory cells MC are arranged in row and column directions.

A plurality of word lines $WL_0$ to $WL_{2m+1}$ are arranged to correspond to rows of the plurality of memory cells MC, so that each word line is connected to gate electrodes of the transistors Qc of the corresponding row of the memory cells MC. When any of the plurality of word lines $WL_0$ to $WL_{2m+1}$ is selected, the memory cells MC connected to the selected word line are put in a selected state.

A plurality of bit lines $BL_0$ to $BL_n$ and a plurality of bit bar lines $/BL_0$ to $/BL_n$ are arranged to correspond to columns of the plurality of memory cells MC, so that each of the bit lines and bit bar lines is connected to the other of the source electrode and the drain electrode of each MOS transistor Qc of the corresponding column of the memory cells MC.

A plurality of plate lines $PL_0$ to $PL_m$ extending in the row direction are arranged every other row of the plurality of memory cells MC, so that each plate line is connected to the other electrode of each of the capacitors Cs of the corresponding two rows of the memory cells MC which is not connected to the corresponding transistor Qc (hereinafter, such an electrode of the capacitor Cs is referred to as a plate electrode).

A plurality of MOS transistors $T_0$ to $T_{2m+1}$ are arranged to correspond to the plurality of word lines $WL_0$ to $WL_{2m+1}$ so that gate electrodes of the plurality of MOS transistors $T_0$ to $T_{2m+1}$ are connected to the corresponding word lines $WL_0$ to $WL_{2m+1}$, source electrodes thereof are connected to the corresponding plate lines $PL_0$ to $PL_m$, and drain electrodes thereof are connected to a drive line DL.

A plate driving signal generation circuit 1 supplies a plate driving signal to the drive line DL.

The operation of the conventional ferroelectric memory device having the above configuration shown in FIG. 6 will be described with reference to FIG. 7.

Figure 7:
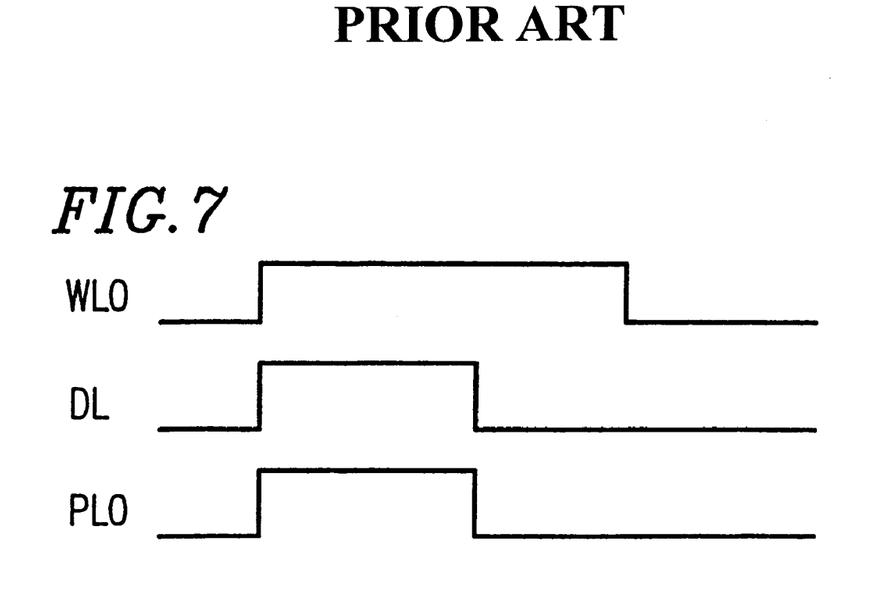
FIG. 7 is a timing chart of the conventional ferroelectric memory device of FIG. 6.

FIG. 7 is a timing chart of the ferroelectric memory device shown in FIG. 6. In a standby state before a word line (e.g., the word line $WL_0$) rises to a selected level (high level), the bit lines $BL_0$ to $BL_n$, the bit bar lines $/BL_0$ to $/BL_n$, and the drive line DL are in a grounding potential level. When the word line $WL_0$ rises to a high level, the memory cells MC connected to the word line $WL_0$ turn to a selected state, and the transistor $T_0$ is turned on, to allow the plate line $PL_0$ to be connected with the drive line DL.

The plate driving signal then becomes a high level to provide a plate driving voltage Vp1, which is applied to the plate line $PL_0$. As a result, information stored in the memory cells MC connected to this plate line is read to the bit lines $BL_0$ to $BL_n$. The bit bar lines $/BL_0$ to $/BL_n$, which are paired with the bit lines $BL_0$ to $BL_n$, respectively, are selectively connected to reference cells (not shown) to generate a reference voltage level. The reference voltage is set at a potential just in the middle of potentials at the bit line generated when the information read from the memory cell MC is "1" and when it is "0". This setting is achieved by adjusting the size of a capacitor of each reference cell.

A voltage difference between the paired ones of the bit lines $BL_0$ to $BL_n$, and the bit bar lines $/BL_0$ to $/BL_n$ is sense-amplified, to read outside the information stored in the memory cells in the selected state. Thereafter, the plate driving signal becomes a low level to provide a grounding potential, which is applied to the plate line $PL_0$. This allows information to be written again in the memory cells in the selected state.

In such a ferroelectric memory device, the ferroelectric film of the capacitor Cs of each memory cell MC is provided with positive and negative induced polarization, to store information in the memory cell MC. The stored information is read by detecting the state of the induced polarization. For this detection, it is required to supply a predetermined potential, such as the potential Vp1, to the corresponding plate line as described above. Since the capacitor Cs is made of a ferroelectric, the capacitance value thereof tends to be greater than that of a conventional DRAM. Moreover, the plate lines are generally made of precious metal, such as Au, Pt, and Ru, for the conformity with the dielectric of the capacitors. It is difficult to thicken Such precious metal since the processability thereof is a problem. An attempt to increase the width of the interconnects (to compensate the poor thickness) will be disadvantageous for realizing miniaturization and thereby high-density construction. For these reasons, it is difficult to reduce the resistance of the interconnects. This increases the time constant of the plate lines, and thus increases the time required for driving the plate lines. As a result, high-speed operation of the conventional ferroelectric memory device is difficult.

Moreover, in the conventional ferroelectric memory device, since the plate lines are charged and discharged, power consumption increases.

Thus, as described above, the conventional ferroelectric memory device has a construction in which the plate lines are driven at a predetermined voltage for each access. This requires a long time for driving the plate lines, making it difficult to realize high-speed operation. Moreover, power consumption increases for charging and discharging of the plate lines.

SUMMARY OF THE INVENTION

The semiconductor memory device of th is invention includes a capacitor, a first transistor, and a second transistor, wherein the capacitor includes a first electrode, a second electrode opposing the first electrode, and a ferroelectric film sandwiched by the first and second electrodes, and stores and holds binary information utilizing a polarizing state of the ferroelectric film, the first transistor includes a first electrode, a second electrode, and a gate electrode, the second electrode being connected to the first electrode of the capacitor, and the second transistor includes a first electrode, a second electrode, and a gate electrode, the first electrode being connected to the second electrode of the capacitor.

In one embodiment of the invention, the semiconductor memory device further includes a word line, a bit line, a bit bar line, and a plurality of column selection plate driving lines, wherein the first electrode of the first transistor is connected to one of the bit line and the bit bar line, the gate electrode of the first transistor is connected to the word line, the second electrode of the second transistor is connected to one of the plurality of column selection plate driving lines, and the gate electrode of the second transistor is connected to the word line.

In another embodiment of the invention, the semiconductor memory device further includes a column selection plate driving circuit for selecting one of the plurality of column selection plate driving lines based on a column address decode signal.

In still another embodiment of the invention, the column selection plate driving circuit includes a main drive line, a plate driving signal generation circuit for supplying a plate driving signal to the main drive line, and a plurality of MOS transistors, gates of the plurality of MOS transistors are respectively connected to a plurality of address decode signal lines, first electrodes of the plurality of MOS transistors are connected to the main drive line, and second electrodes of the plurality of MOS transistors are respectively connected to the plurality of column selection plate driving lines.

Alternatively, the semiconductor memory device of this invention includes: a plurality of memory cells arranged in row and column directions, a plurality of word lines extending in the row direction, a plurality of bit lines extending in the column direction, a plurality of bit bar lines extending in the column direction, a plurality of column selection plate driving lines extending in the column direction, and a plurality of second transistors, wherein each of the plurality of memory cells includes a capacitor and a first transistor, the capacitor includes a first electrode, a second electrode opposing the first electrode, and a ferroelectric film sandwiched by the first and second electrodes, and stores and holds binary information utilizing a polarizing state of the ferroelectric film, the first transistor includes a first electrode, a second electrode, and a gate electrode, each of the plurality of second transistors includes a first electrode, a second electrode, and a gate electrode, the first electrode of the first transistor is connected to one of the plurality of bit lines and the plurality of bit bar lines, the second electrode of the first transistor is connected to the first electrode of the capacitor, the plurality of memory cells are classified into a plurality of groups, the second electrodes of the capacitors of a plurality of memory cells of a group in a first row are connected to the first electrode of one of the plurality of second transistors via a plate line, the second electrode of the one of the plurality of second transistors in the first row is connected to one of the plurality of column selection plate driving lines, the gate electrode of the one of the plurality of second transistors in the first row is connected to one of the plurality of word lines, the gate electrode of the first transistor in the first row is connected to the word line to which the second transistor in the first row is connected, the second electrodes of the capacitors of a plurality of memory cells of a group in a second row are connected to the first electrode of one of the plurality of second transistors via a plate line, the second electrode of the one of the plurality of second transistors in the second row is connected to the one of the plurality of column selection plate driving lines, the gate electrode of the one of the plurality of second transistors in the second row is connected to one of the plurality of word lines, and the gate electrode of the first transistor in the second row is connected to the word line to which the second transistor in the second row is connected.

Thus, the invention described herein makes possible the advantage of providing a semiconductor memory device capable of operating at high speed with reduced power consumption.

This and other advantages of the present invention will become apparent to those skilled in the art upon reading and understanding the following detailed description with reference to the accompanying figures.

DESCRIPTION OF THE PREFERRED EMBODIMENTS

The present invention will be described by way of examples with reference to the accompanying drawings.

EXAMPLE 1

A ferroelectric memory device of Example 1 according to the present invention will be described with reference to FIGS. 1, 2A, and 2B.

Figure 1:
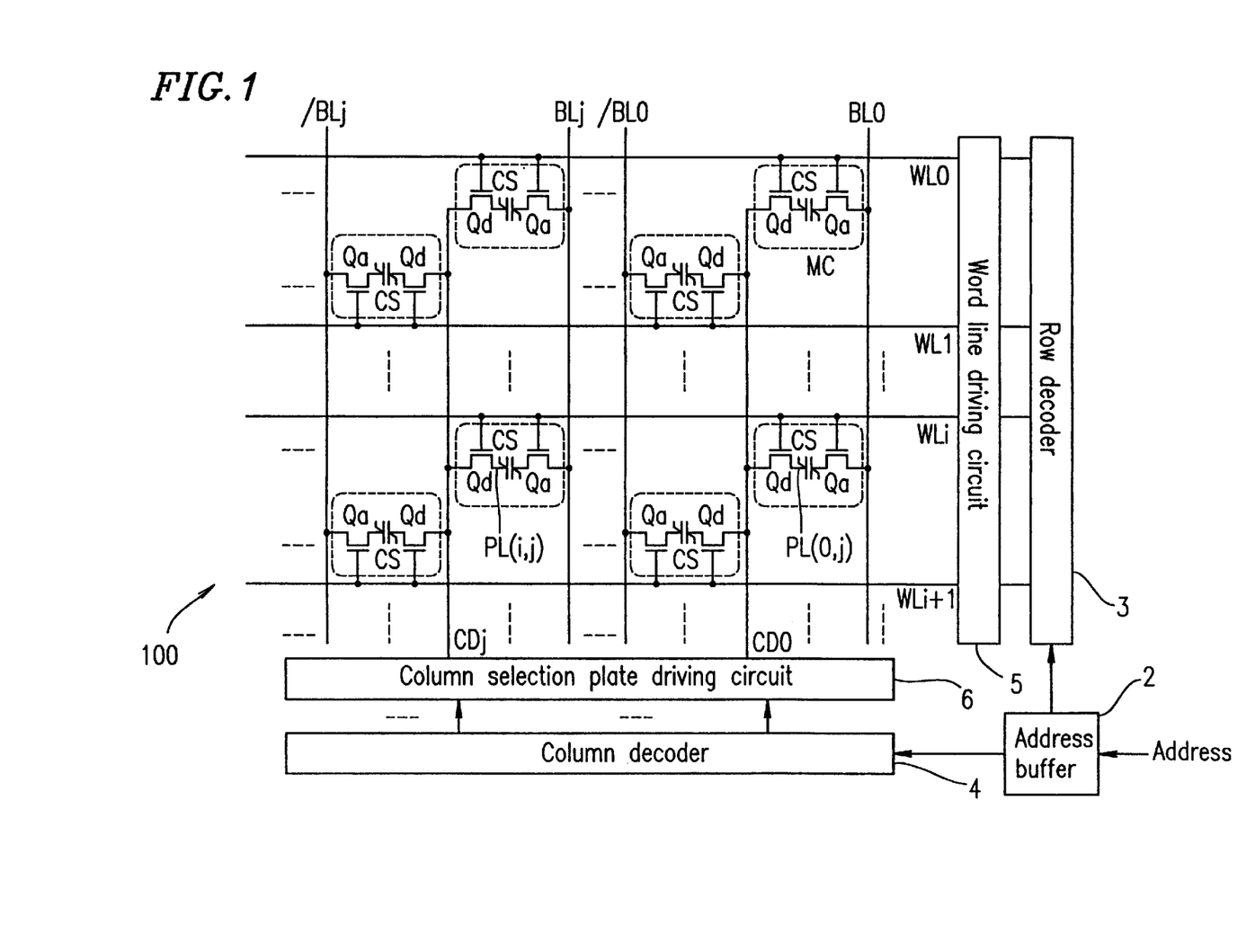
FIG. 1 is a circuit diagram of a ferroelectric memory device of Example 1 according to the present invention.
Figure 2A:
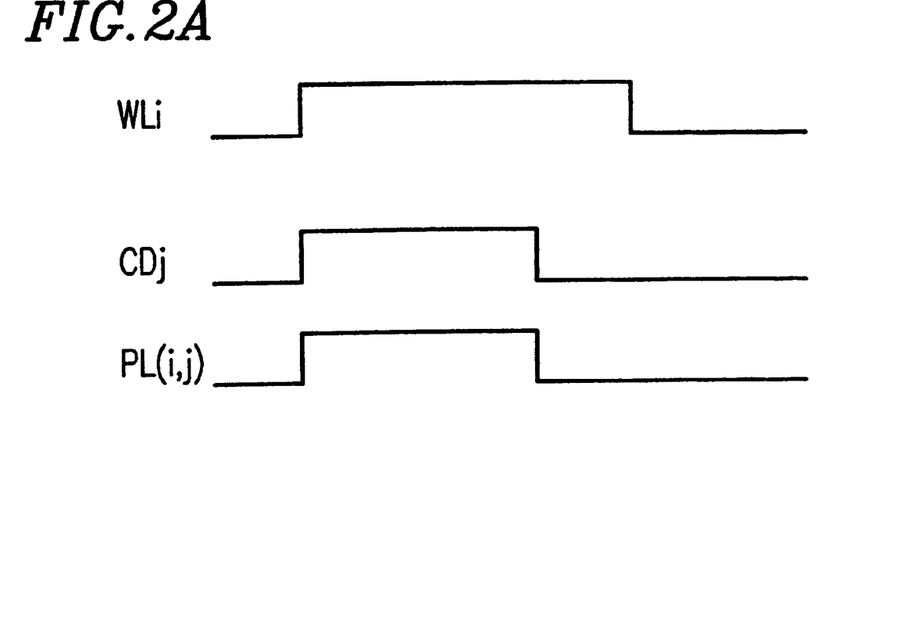
FIGS. 2A and 2B timing charts of the ferroelectric meric Example 1.
Figure 2B:
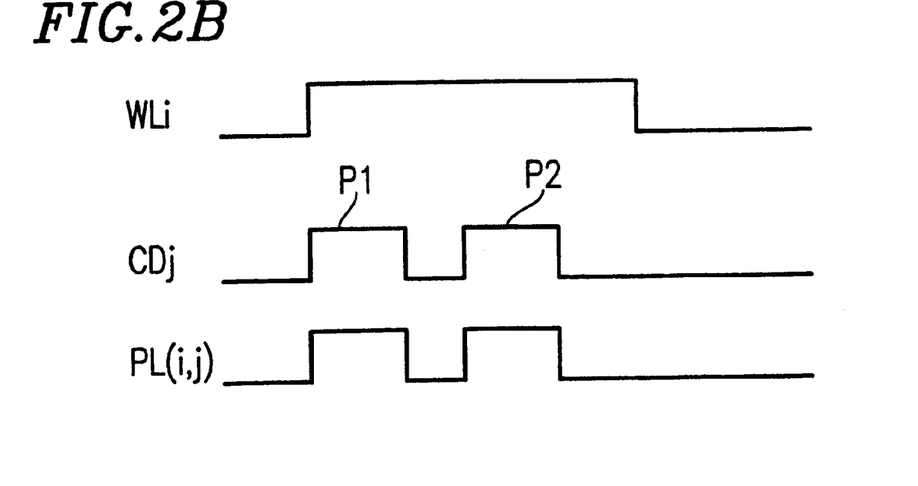

FIG. 1 is a circuit diagram of a ferroelectric memory device 100 of Example 1. FIGS. 2A and 2B are timing charts of the ferroelectric memory device 100 shown in FIG. 1.

The ferroelectric memory device 100 shown in FIG. 1 includes a plurality of memory cells MC arranged in row and column directions. Each of the memory cells MC has a capacitor Cs, a first transistor Qa, and a second transistor Qd.

The capacitor Cs includes a first electrode and a second electrode opposing the first electrode, with a ferroelectric film sandwiched by the first and second electrodes. The capacitor Cs stores and holds binary information utilizing the polarization state of the ferroelectric film. Hereinafter, the second electrode of the capacitor Cs is also referred to as a plate electrode.

The first transistor Qa includes source and drain electrodes (one of these electrodes is also referred to as the first electrode, while the other is also referred to as the second electrode), and a gate electrode. The second electrode of the first transistor Qa is connected to the first electrode of the capacitor Cs.

The second transistor Qd includes source and drain electrodes (one of these electrodes is also referred to as the first electrode, while the other is also referred to as the second electrode), and a gate electrode. The first electrode of the second transistor Qd is connected to the second electrode of the capacitor Cs.

A plurality of word lines $WL_0$, $WL_1$, . . . are arranged to correspond to rows of the plurality of memory cells MC, so that each word line is connected to gate electrodes of the transistors Qa and Qd of the corresponding row of the memory cells MC.

A plurality of bit lines $BL_0$, $BL_1$, . . . and a plurality of bit bar lines $/BL_0$, $/BL_1$, . . . are arranged to correspond to columns of the plurality of memory cells MC, so that each of the bit lines and bit bar lines is connected to the first electrode (one of the source electrode and the drain electrode) of each of the transistors Qa of the corresponding column of the memory cells MC.

The second electrode (one of the source electrode and the drain electrode) of the transistor Qd of each of the columns of the memory cells MC is connected to corresponding one of a plurality of column selection plate driving lines $CD_0$, $CD_1$, . . . Herein, in a memory cell located in the i-th row and the j-th column, the plate electrode of the capacitor Cs as a node is referred to as PL(i,j).

The ferroelectric memory device 100 shown in FIG. 1 further includes: an address buffer 2 which receives an address signal generated externally (or internally); a row decoder 3 and a column decoder 4 which receive a signal output from the address buffer 2; a word line driving circuit 5 which receives an address decode signal output from the row decoder 3 and drives the word lines $WL_0$, $WL_1$, . . . ; and a column selection plate driving circuit 6 which receives a column address decode signal output from the column decoder 4 and drives the column selection plate driving lines $CD_0$, $CD_1$, . . .

The column selection plate driving lines $CD_0$, $CD_1$, . . . are made of polysilicon interconnects or normal metal interconnects (such as aluminum interconnects).

The operation of the ferroelectric memory device 100 shown in FIG. 1 will be described with reference to FIG. 2A.

In a standby state before a word line rises to a selected level (high level), the bit lines $BL_0$, $BL_1$, . . . , the bit bar lines $/BL_0$, $/BL_1$, . . . , and the column selection plate driving lines $CD_0$, $CD_1$, . . . are in a grounding potential level. When a predetermined word line (e.g., a word line $WL_i$) rises to a selected level in response to the external address signal, the transistors Qa of the memory cells MC connected to the word line $WL_i$ are turned on, to allow the first electrode of each of the capacitors Cs of the memory cells MC to be put in the grounding potential level which is the same as the potential level of the bit lines or the bit bar lines.

When the transistors Qd of the memory cells MC connected to the word line $WL_i$ are turned on, the column selection plate driving lines $CD_0$, $CD_1$ (not shown), . . . are connected to the plate electrodes PL(i,0), PL(i,1) (not shown), . . . , respectively.

Under the above state, when a predetermined column selection plate driving line (e.g., the column selection plate driving line $CD_j$) becomes a selected level in response to an external column address input, only the plate electrode PL(i,j) is put in a high level Vp1, while the other plate electrodes of the same row remain in the grounding potential level.

As a result, only information stored in the memory cell MC in the i-th row and the j-th column is read to the bit line $BL_j$. More specifically, referring to FIG. 8, by applying a negative electric field $-E_{max}$ between the bit line $BL_j$ and the plate electrode PL(i,j) when the transistor Qa is in the "on" state, a charge corresponding to Pmax+Pr can be read to the bit line $BL_j$ when the stored data is "1" held at point c in the hysteresis characteristics, while a charge corresponding to Pmax−Pr can be read from when the stored data is "0" held at point a.

The bit bar line $/BL_j$ which is paired with the bit line $BL_j$ is put in a reference voltage level by selecting a reference cell (not shown). Information stored in the memory cell in the selected state can be read outside by sense-amplifying a potential difference between the pair of the bit line $BL_j$ and the bit bar line $/BL_j$.

In any non-selected memory cell which is not in the j-th column, no potential difference is generated between the pair of the bit line and the bit bar line. Accordingly, information stored in such a memory cell is not sense-amplified to be read outside. In other words, only the memory cell MC located in the i-th row and the j-th column is sense-amplified.

Thereafter, the signal at the column selection plate driving line $CD_j$ becomes the grounding potential level, and thus the voltage at the plate electrode PL(i,j) becomes the grounding potential. This allows information to be written again in the memory cell in the selected state. In the timing chart shown in FIG. 2A, a read and a rewrite are completed by one pulse of the column selection plate driving signal. Alternatively, the ferroelectric memory device 100 may be operated according to the timing chart shown in FIG. 2B. In the timing chart shown in FIG. 2B, while the word line is in the selected level, a read is completed by a pulse P1 of the column selection plate driving signal and then a rewrite is ensured by a subsequent pulse P2 of the column selection plate driving signal.

Figure 8:
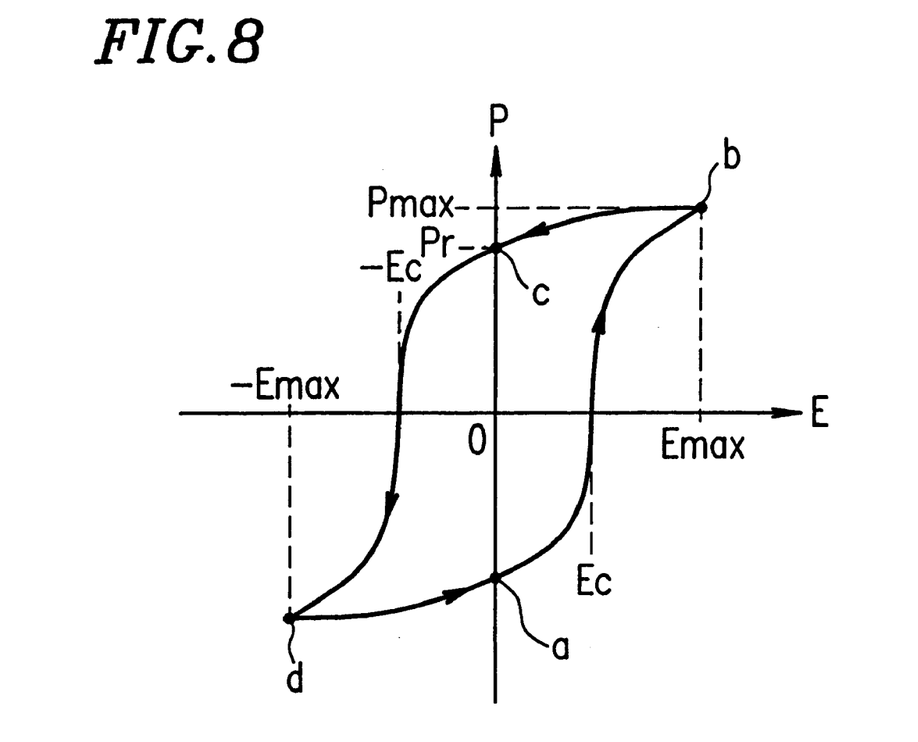
FIG. 8 is a graph showing hysteresis characteristics of applied electric field vs. polarization of a ferroelectric memory cell.

The rewrite as used herein refers to an operation as follows. Referring to FIG. 8, in the read operation described above, the state at point a has been changed to the state at point a, resulting in breaking the data at point a. Thus, a positive electric field Emax is applied to the ferroelectric film of the capacitor, to resume the state at point c.

As for any non-selected memory cell MC which is not in the i-th row, since the capacitor Cs of the memory cells MC is isolated from the bit line (or the bit bar line) by the transistors Qa and Qd, the voltage between the electrodes of the capacitor Cs does not vary, irrespective of whether or not the voltage Vp1 is applied to the column plate driving line $CD_x$ (x is an integer excluding i), preventing the polarization information from being broken. As for any memory cell MC which is connected to the selected word line $WL_i$ and connected to the column selection plate driving lines CD in a non-selected level, no sense-amplification is performed, preventing the polarization information from being broken.

In the ferroelectric memory device 100 shown in FIG. 1, the column selection plate driving circuit 6 is only required to drive the plate electrode PL(i,j) of a single memory cell MC for each access operation, and thus the capacitance value and resistance value thereof are small. This reduces the time required to drive the plate electrode and thus realizes high-speed operation and low power consumption. Moreover, since only information stored in a single memory cell MC is sense-amplified, the current consumption in the sense-amplification is also greatly reduced.

EXAMPLE 2

A ferroelectric memory device of Example 2 according to the present invention will be described with reference to FIGS. 3 and 4.

Figure 3:
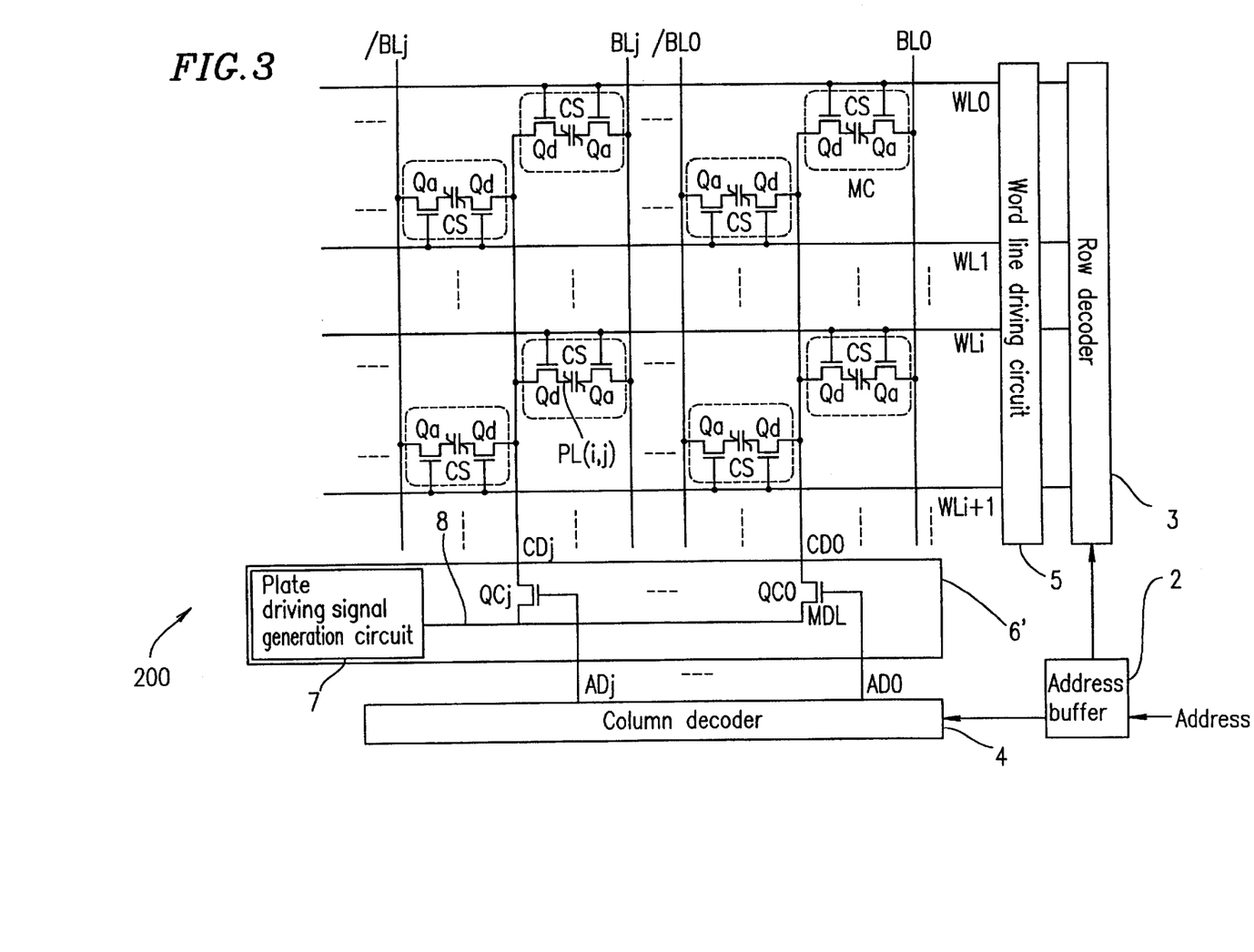
FIG. 3 is a circuit diagram of a ferroelectric memory device of Example 2 according to the present invention.

FIG. 3 is a circuit diagram of a ferroelectric memory device 200 of Example 2. The ferroelectric memory device 200 includes a plurality of memory cells MC, a plurality of word lines $WL_0$, $WL_1$, . . . , a plurality of bit lines $BL_0$, $BL_1$, . . . , a plurality of bit bar lines $/BL_0$, $/BL_1$, . . . , and a column selection plate driving circuit 6'.

The construction of the ferroelectric memory device 200 shown in FIG. 3 is the same as that of the ferroelectric memory device 100 except for the column selection plate driving circuit 6'. In the ferroelectric memory device 200, the same components as those of the ferroelectric memory device 100 are denoted by the same reference numerals, and the description thereof is basically omitted.

The column selection plate driving circuit 6' includes a main drive line 8, a plate driving signal generation circuit 7 which outputs a plate driving signal to the main drive line 8, and a plurality of MOS transistors $QC_0$, . . . $QC_j$, . . .

Gates of the plurality of MOS transistors $QC_0$, . . . $QC_j$, . . . are connected to address decode signal lines $AD_0$, . . . , $AD_j$, . . . connected to the column decoder 4, respectively. Drains or sources of the plurality of MOS transistors $QC_0$, . . . $QC_j$, . . . are commonly connected to the main drive line 8. The others of the drains and sources of the plurality of MOS transistors $QC_0$, . . . $QC_j$, . . . are connected to the column selection plate driving lines $CD_0$, . . . , $CD_j$, . . . , respectively.

Hereinbelow, the operation of the ferroelectric memory device 200 will be described with reference to FIG. 4.

Figure 4:
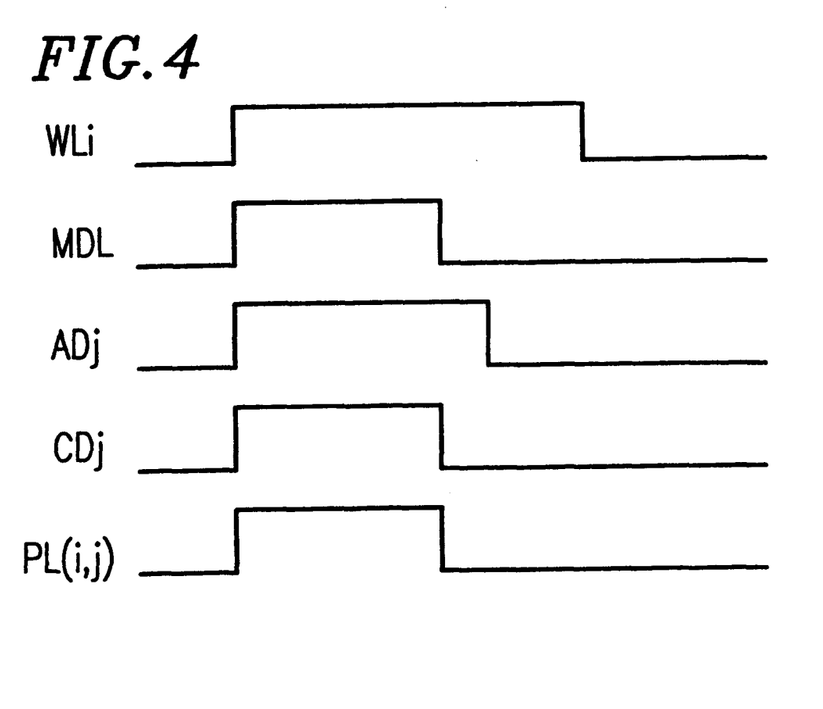
FIG. 4 is a timing chart of the ferroelectric memory device of Example 2.

FIG. 4 is a timing chart of the ferroelectric memory device 200. In a standby state before a word line rises to a selected level (high level), the bit lines $BL_0$, $BL_1$, . . . , the bit bar lines $/BL_0$, $/BL_1$, . . . , and the column selection plate driving lines $CD_0$, $CD_1$, . . . are in a grounding potential level.

When an external row address signal is input into the ferroelectric memory device 200, a word line (e.g., the word line $WL_i$) becomes a selected level in response to the row address signal. When the word line WL becomes a selected level, the transistors Qa of the memory cells MC connected to the selected word line WL are turned on, to allow the first electrode of each of the capacitors Cs of the memory cells MC to be put in the grounding potential level which is the same as the potential level of the bit lines or the bit bar lines.

The transistors Qd of the memory cells MC connected to the selected word line WL are also turned on, to allow the second electrode of each of the capacitors Cs to be connected to the corresponding column selection plate driving line CD.

The plate driving signal generation circuit 7 outputs a main drive signal MDL (a high voltage Vp1) as a plate driving signal, to the main drive line 8. The column decoder 4 outputs address decode signals $ADS_0$, . . . , $ADS_j$, . . . to the column selection plate driving circuit 6'. The column selection plate driving circuit 6' selects at least one column selection plate driving line CD based on the address decode signals $ADS_0$, . . . , $ADS_j$, . . . The main drive signal MDL is then supplied to the selected column selection plate driving line CD.

For example, when only the address decode signal $ADS_j$ is in a certain voltage level which is different from others, only the column selection plate driving signal line $CD_j$ is at the Vp1 level. This turns only the plate electrode PL(i,j) to the Vp1 level, while the other plate electrodes remain in the high impedance state.

As a result, as in Example 1 described above, only information stored in the memory cell MC in the i-th row and the j-th column is read to the bit line $BL_j$ and sense-amplified. The sense-amplified information is then read outside. After the read operation, while the address decode signal $AD_j$ is still in the selected level, the main drive line 8 is returned to the grounding potential level. This turns again the column selection plate driving signal line $CD_j$ and the plate electrode PL(i,j) to the grounding potential level, to allow information to be written again in the memory cell in the selected state.

EXAMPLE 3

A ferroelectric memory device of Example 3 according to the present invention will be described with reference to FIG. 5.

Figure 5:
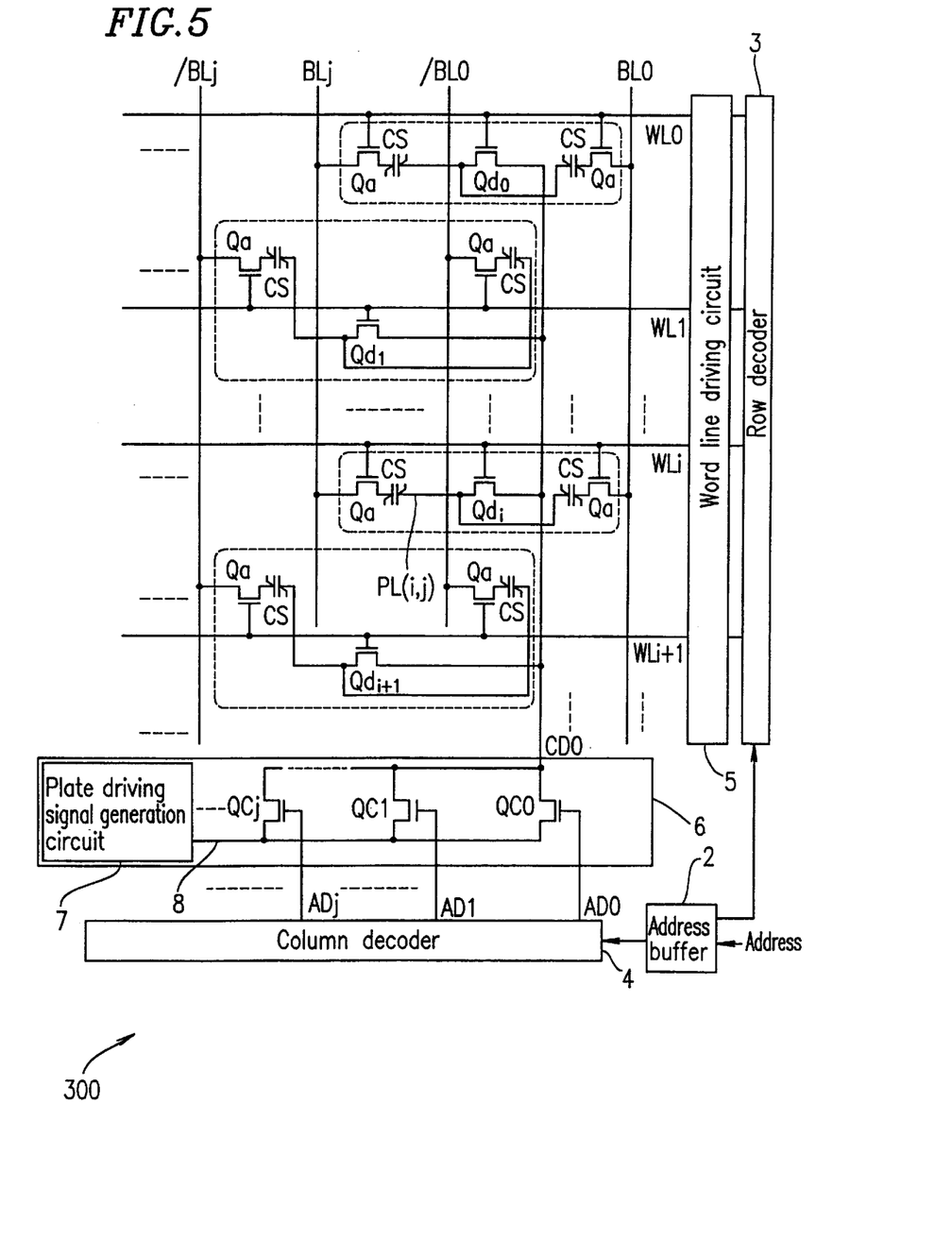
FIG. 5 is a circuit diagram of a ferroelectric memory device of Example 3 according to the present invention.

FIG. 5 is a circuit diagram of a ferroelectric memory device 300 of Example 3. The ferroelectric memory device 300 includes a plurality of memory cells MC, a plurality of word lines $WL_0$, $WL_1$, . . . , a plurality of bit lines $BL_0$, $BL_1$, . . . , a plurality of bit bar lines $/BL_0$, $/BL_1$, . . . , and a column selection plate driving circuit 6".

In Example 3, the a-th to (a+j)-th columns are regarded as one unit. For example, the bit lines $BL_0$ to $BL_j$ and the bit bar lines $/BL_0$ to $/BL_j$ are regarded as one unit, while the bit lines $BL_{j+1}$ to $BL_{2j+1}$ and the bit bar lines $/BL_{j+1}$ to $/BL_{2j+1}$ are regarded as one unit.

In a certain row, the first electrodes of the capacitors Cs of the memory cells MC which are in the 0-th to (0+j)-th rows are connected to the transistors Qa of the respective memory cells MC. In a certain row, the second electrodes of the capacitors Cs of the memory cells MC which are in the 0-th to (0+j)-th row are connected to one common transistor Qd via a certain plate line. In a certain row, the each gate electrode of the transistors Qa and Qd is connected to the word line WL.

For example, the second electrodes of the capacitors Cs of the plurality of memory cells MC connected to the word line $WL_0$ and connected to the bit lines $BL_0$ to $BL_j$ are connected to the first electrode of the transistor $Qd_0$ via a certain plate line. The gate electrode of the transistor $Qd_0$ is connected to the word line $WL_0$.

The second electrodes of the capacitors Cs of the plurality of memory cells MC connected to the word line $WL_1$, and connected to the bit bar lines $/BL_0$ to $/BL_j$ are connected to the first electrode of the transistor $Qd_1$ via a certain plate line. The gate electrode of the transistor $Qd_1$ is connected to the word line $WL_1$.

The second electrodes of the capacitors Cs of the plurality of memory cells MC connected to the word line $WL_i$ and connected to the bit lines $BL_0$ to $BL_j$ are connected to the f first electrode of the transistor $Qd_i$ via a certain plate line. The gate electrode of the transistor $Qd_i$ is connected to the word line $WL_i$.

The second electrodes of the transistors $Qd_0$, . . . , $Qd_i$ are connected to the common column selection plate driving line $CD_0$. The first electrode as used herein is referred to as either one of the source and the drain of a transistor, while the second electrode as used herein is referred to as the other of the source and the drain.

Although not shown in FIG. 5, the second electrodes of the capacitors Cs of the plurality of memory cells MC connected to the word lines $WL_i$ and connected to the bit lines $BL_{j+1}$ to $BL_{2j+1}$ or the bit bar lines $/BL_{j+1}$ to $/BL_{2j+1}$ are connected to the common column selection plate driving line $CD_1$ via the corresponding transistors.

The column selection plate driving circuit 6" includes a main drive line 8, a plate driving signal generation circuit 7 which outputs a plate driving signal to the main drive line 8, and a plurality of MOS transistors $QC_0, \ldots QC_j, \ldots$ Gates of the plurality of MOS transistors $QC_0, \ldots QC_j, \ldots$ are connected to address decode signal lines $AD_0, \ldots, AD_j, \ldots$ connected to the column decoder 4, respectively.

The first electrodes of the plurality of MOS transistors $QC_0, \ldots QC_j$ are commonly connected to the main drive line 8. The second electrodes of the plurality of MOS transistors $QC_0, \ldots QC_j$ are commonly connected to the column selection plate driving line $CD_0$. The first electrode as used herein is referred to as either one of the source and the drain of a transistor, while the second electrode as used herein is referred to as the other of the source and the drain.

The common column selection plate driving line $CD_0$ is configured to transmit an output of the plate driving signal generation circuit 7 when any of the 0-th to j-th columns is selected in response to the address decode signal output from the column decoder 4. In this example, address decode signals for the 0-th to j-th columns are input into gates of the transistors $Qc_0$ to $Qc_j$, respectively.

With the above construction, the number of the transistors Qd required in the ferroelectric memory device can be reduced to $1/(j+1)$. This reduces the area of the memory cells MC and thus reduces the production cost of the ferroelectric memory device.

Thus, in the semiconductor memory device according to the present invention, the plate of the memory cells is divided into sections in row and column directions. This makes it possible to select and operate only one memory cell among the plurality of memory cells by a single access operation of the semiconductor memory device. As a result, the plate driving time can be reduced, compared with the conventional semiconductor memory device, and thus high-speed operation of the memory cells is possible. Additionally, in the semiconductor memory device according to the present invention, power consumption can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly. construed.

What is claimed is:

1. A semiconductor memory device comprising a capacitor, a first transistor, a second transistor, a word line, a bit line, a bit bar line, and a plurality of column selection plate driving lines, wherein the capacitor includes a first electrode, a second electrode opposing the first electrode, and a ferroelectric film sandwiched by the first and second electrodes, and stores and holds binary information utilizing a polarizing state of the ferroelectric film, the first transistor includes a first electrode, a second electrode, and a gate electrode, the second electrode being connected to the first electrode of the capacitor, the first electrode is connected to one of the bit line and the bit bar line, the gate electrode is connected to the word line, and the second transistor includes a first electrode, a second electrode, and a gate electrode, the first electrode being connected to the second electrode of the capacitor, the second electrode is connected to one of the plurality of column selection plate driving lines, the gate electrode is connected to the word line.

2. A semiconductor memory device according to claim 1, further comprising a column selection plate driving circuit for selecting one of the plurality of column selection plate driving lines based on a column address decode signal.

3. A semiconductor memory device according to claim 2, wherein the column selection plate driving circuit includes a main drive line, a plate driving signal generation circuit for supplying a plate driving signal to the main drive line, and a plurality of MOS transistors, gates of the plurality of MOS transistors are respectively connected to a plurality of address decode signal lines, first electrodes of the plurality of MOS transistors are connected to the main drive line, and second electrodes of the plurality of MOS transistors are respectively connected to the plurality of column selection plate driving lines.

4. A method of driving a semiconductor memory device comprising a capacitor, a first transistor, a second transistor, a word line, a bit line, a bit bar line, and a plurality of column selection plate driving lines, the capacitor includes a first electrode, a second electrode opposing the first electrode, and a ferroelectric film sandwiched by the first and second electrodes, and stores and holds binary information utilizing a polarizing state of the ferroelectric film, the first transistor includes a first electrode, a second electrode, and a gate electrode, the second electrode being connected to the first electrode of the capacitor, the first electrode is connected to one of the bit line and the bit bar line, the gate electrode is connected to the word line, and the second transistor includes a first electrode, a second electrode, and a gate electrode, the first electrode being connected to the second electrode of the capacitor, the second electrode is connected to one of the plurality of column selection plate driving lines, the gate electrode is connected to the word line, comprising the steps of:

raising the word line to a selected voltage level, so that the first and second transistors are turned on, thereby allowing the first electrode of the capacitor to be connected to the potential level of one of the bit line and the bit bar line, and allowing the second electrode of the capacitor to be connected to the potential level of one of the plurality of column selection plate driving lines;

raising the voltage level of the respective column selection plate driving line from a first level to a second level;

accessing the capacitor; and thereafter dropping the voltage level of the respective column selection plate driving line from the second level to the first level.

5. A semiconductor memory device having a plurality of units, wherein a unit comprises a plurality ij of memory cells arranged in i rows and j columns so that an individual memory cell$_{ij}$ is positioned in the ith row and the jth column, a plurality i of word lines extending in the row direction, a plurality j of bit lines extending in the column direction, a plurality j of bit bar lines extending in the column direction, a column selection plate driving line for said unit extending in the column direction, and a plurality i of second transistors, wherein each of the plurality of memory cells includes a capacitor and a first transistor, the capacitor includes a first electrode, a second electrode opposing the first electrode, and a ferroelectric film sandwiched by the first and second electrodes, and stores and holds binary information utilizing a polarizing state of the ferroelectric film, the first transistor includes a first electrode, a second electrode, and a gate electrode, each of the plurality of second transistors includes a first electrode, a second electrode, and a gate electrode, and wherein for each occurrence of m and n, m being an integer from 1 to i inclusive and n being an integer from 1 to j inclusive:

the first electrode of the first transistor of the memory cell in row i–m and column j–n is connected to one of bit lines j–n and bit bar lines j–n, the second electrode of the first transistor of the memory cell in row i–m and column j–n is connected to the first electrode of second transistor i–m, the second electrode of each of the capacitors of the memory cells in row i–m is connected to the first electrode of second transistor i–m, the second electrode of second transistor i–m in row i–m is connected to said column selection plate driving line, the gate electrode of second transistor i–m in row i–m is connected to word line i–m, and the gate electrode of each first transistor in the memory cells in row i–m is connected to word line i–m.

* * * * *